United States Patent [19]

Fujimura et al.

[11] 4,410,457
[45] Oct. 18, 1983

[54] CONDUCTIVE PASTE

[75] Inventors: Kenji Fujimura, Hachioji; Shigeru Sekiya, Oume; Kunimasa Kamio, Toyonaka; Koichi Okuno, Izumiotsu; Satoru Haraguchi, Minoo; Koiti Ohasi, Higashiosaka; Hiroyuki Yamaguchi, Toyonaka, all of Japan

[73] Assignees: Sumitomo Chemical Co., Ltd., Osaka; Sumitomo Metal Mining Company, Ltd., Tokyo, both of Japan

[21] Appl. No.: 375,096

[22] Filed: May 5, 1982

[30] Foreign Application Priority Data

May 11, 1981 [JP] Japan ................................. 56-71168

[51] Int. Cl.$^3$ ............................................. H01B 1/06
[52] U.S. Cl. ................................. 252/508; 252/511; 252/312; 252/513; 252/514
[58] Field of Search ............... 252/502, 503, 508, 511, 252/513, 514, 518, 519; 523/427, 429, 440, 442, 457, 458, 459; 525/523, 524, 525, 526

[56] References Cited

U.S. PATENT DOCUMENTS 3,998,779 12/1976 Barr ..................................... 260/37 E
4,155,896 5/1979 Rennier et al. ....................... 252/513
4,312,793 1/1982 Charneski et al. ................... 252/513

Primary Examiner—Josephine Barr
Attorney, Agent, or Firm—Armstrong, Nikaido, Marmelstein & Kubovcik

[57] ABSTRACT

An electroconductive paste comprising
  (a) an electroconductive filler,
  (b) a reactive solvent, and
  (c) a hardener comprising
    (c-1) an epoxy resin,
    (c-2) a latent hardener, and
    (c-3) an epoxy compound-dialkylamine adduct, the percent by weight of (a), (b) and (c) being 95 to 50, 1 to 20 and 4 to 30, respectively, and the weight ratio of (c-1):(c-2):(c-3) being 100:0 to 30:0.1 to 40. The paste is useful for bonding electronic elements to metal lead frames and/or substrates.

6 Claims, No Drawings

CONDUCTIVE PASTE

The present invention relates to a conductive paste, particularly suitable for the bonding of electronic parts.

For the bonding of electronic elements (hereinafter called chips) such as semiconductor integrated circuits light-emitting diodes, etc. to metal lead frames and/or substrates, electroconductive pastes are becoming to be used more and more.

The chip-bonding is carried out by a process which comprises drop-feeding the electroconductive paste on the place of the metal lead frame or substrate to which the chip should be fixed, then press-mounting the chip on the dropped paste, and finally subjecting the bonded chips collected into a suitable number to hardening treatment in a heating furnace. The chip-bonded metal lead frame or substrate is further subjected to wire-bonding and then resin-molded or cap-sealed to obtain a final product.

The electroconductive pastes usable for such purposes are required to have the following properties, in consideration of the above-mentioned chip-bonding process:

(A) the usable duration (so-called "pot life") should be as long as possible, (B) the time necessary for hardening should be as short as possible, (C) the quantity of released gas upon hardening should be as little as possible, and the gas should not be harmful, particularly to semiconductor elements, and (D) the resin after hardening should have excellent heat resistance.

By the usable duration is meant a time span from the moment of the drop-feed of the paste up to the time at which the paste, after standing at room temperature, loses its chip-bonding ability.

In the chip-bonding process, there are cases where a long time is necessary from the moment of paste drop-feed up to chip mounting, so that too short a usable duration will cause a bad operability and a fluctuation in chip-bonding strength after hardening.

The electroconductive pastes usable for the above-mentioned purposes comprises an electroconductive filler, a thermosetting resin such as epoxy resin, a hardener and a solvent, etc.

As the hardener, for example, an acid anhydride, boron trifluoride-amine complex, amine compound, and the like are usually used. However, in the case of using acid anhydride or boron trifluoride amine complex, the usable duration is long, but a high temperature and a long time are necessary for hardening, whereas in case of using the amine compounds, the hardening time becomes short but the usable duration becomes also short. Therefore it has been difficult to satisfy both properties (A) and (B) at the same time by conventional hardeners.

As the solvents which are used for regulating a great increase of the viscosity when the electroconductive filler is incorporated, there are reactive ones and non-reactive ones. Since reactive solvents such as epoxy compounds have a low molecular weight, they have a defect such that the heat resistance of the resin after hardening is lowered. For this reason, in order to maintain a good heat resistance, non-reactive solvents are used in most cases. But in such a case, since the solvent evaporates almost completely at the time of hardening, the quantity of released gas becomes very large.

The present inventors have studied to improve the drawbacks of conventional electroconductive pastes and provide an electroconductive paste having all of the properties (A), (B), (C) and (D), and attained to the present invention.

The present invention provides a electroconductive paste comprising (a) an electroconductive filler, (b) a reactive solvent, and (c) a hardening compound comprising (c-1) an epoxy resin, (c-2) a latent hardener, and (c-3) an epoxy compound-dialkylamine adduct, the percent by weight of (a), (b) and (c) being 95 to 50, 1 to 20 and 4 to 30, respectively, and the weight ratio of (c-1):(c-2):(c-3) being 100:0 to 30:0.1 to 40.

The present invention is explained in detail in the following.

The electroconductive filler (a) usable in the present invention may be any electroconductive fine powder made of a noble metal such as gold, silver, platinum, etc. a base metal such as nickel, aluminum, etc. and non-metal such as carbon. The powder may be made of an alloy or in a mixture of two or more of the powders. Usually, the powder has a particle diameter of about 0.1 to 10 $\mu$m. The powder in flake form is preferable in respect of electroconductivity. The quantity of the electroconductive filler may be altered depending on the specific gravity of the powder to be used and ranges from 50 through 95% by weight based on the weight of the paste. A quantity less than 50% by weight will not make the hardened product electroconductive. Whereas, if the quantity exceeds 95% by weight, the ratio of the epoxy resin becomes too low, which will results in insufficiency of adhesive strength.

As the reactive solvents, suitable are epoxy compounds such as phenylglycidyl ether, butylglycidyl ether, neopentyl glycol glycidyl ether, etc. Since the reactive solvent as used for the regulation of the viscosity of the paste, it should be limited to a necessary minimum. With the increase in the quantity added, the quantity of released gas increases and the heat resistance of the resin after hardening lowers. For this reason, the suitable quantity to be added ranges from 1 through 20% by weight. If the quantity is less than 1% by weight, the viscosity of the composition becomes too high. If the quantity exceeds 20% by weight, the quantity of released gas upon hardening becomes too much or the characteristics of the hardened product will be impaired.

As the epoxy resin usable for the hardening component, any can be used which has two or more epoxy groups per molecule. Such epoxy resins include, for example, polyglycidyl ethers produced by the reaction between a polyhydric phenol (e.g. bisphenol A, bisphenol F, catechol, resorcin, etc.) or a polyhydric alcohol (e.g. glycerin, polyethylene glycol, etc.) and epichlorohydrin; polyglycidyl ether esters produced by the reaction between a hydroxycarboxylic acid (e.g. p-oxybenzoic acid, beta-oxynaphthoic acid, etc.) and epichlorohydrin; polyglycidyl esters obtained from a polycarboxylic acid (e.g. phthalic acid, terephthalic acid, etc.); glycidylamine compounds obtained from 4,4'-diaminodiphenyl methane, m-aminophenol, etc.; epoxidized novolacs and epoxidized polyolefins.

As the latent hardener, there can be used those known latent hardeners such as urea, guanidine, hydrazine, hydrazide, amidine, triazine, azo compounds, etc.

Concrete examples of these compounds include acetylmethyl urea, benzylurea, thiourea, 3-(substituted or unsubstituted)phenyl-1,1-di-$C_1$–$C_4$ alkylurea (e.g. 3-phenyl-1,1-dimethylurea, 3-(4-chlorophenyl)-1,1-dimethylurea, 3-(3,4-dichlorophenyl)-1,1-dimethylurea, 3-phenyl-1,1-dibutylurea, etc.), acetylsemicarbazide, acetaldehyde, semicarbazone, acetone semicarbazone, N,N'-diphenylguanidine, methylguanidine, biguanide, dicyandiamide, sebacic acid dihydrazide, succinic acid dihydrazide, adipic acid dihydrazide, tartaric acid dihydrazide, dicyandiamidine, hydrazobenzene, acetaldehyde phenylhydrazone, benzophenone phenylhydrazone, benzamidine, melamine, azobenzene, diaminoazobenzene, etc. The quantity to be used is 0 to 30 parts by weight based on 100 parts by weight of the epoxy resin. If the quantity is more than 30 parts by weight, it is impossible to obtain stable properties after hardening.

The epoxy compound-dialkylamine adduct usable for the hardening component functions as a hardening promotor. The dialkylamine usable for the preparation of the adduct, which alkyl may be unsubstituted or substituted, includes dimethylamine, dipropylamine, N-methylethylamine, N-ethylisopropylamine, diallylamine, dibenzylamine or the like, and N-ethylethanolamine, diethanolamine or the like. The epoxy compound includes, for example, monoepoxy compounds represented by butylglycidyl ether and phenylglycidyl ether, epoxy resins obtained from the above-exemplified polyhydric phenols, polycarboxylic acids and amines.

At least one member of the epoxy compounds and an excess quantity of the dialkylamine are mixed in a solvent and allowed to react under heating. After completion of the reaction, the unreacted amine and solvent are removed by distillation to obtain the epoxy compound-dialkylamine adduct having a desired softening point.

As such solvents, those which are capable of dissolving the epoxy compound and have a boiling point above 50° C. are suitable. They include, for example, tetrahydrofuran, dioxane, acetone, methyl ethyl ketone, toluene, monochlorobenzene, methylcellosolve, ethylcellosolve, etc. Of these, ethylcellosolve and toluene are preferable.

The adducts thus obtained are pulverized by an atomizer or the like and are used in the form of powder in the present invention. The powder may be further surface-treated with an acidic substance. The surface-treated adduct is preferable in view of the storage stability of the electroconductive pastes.

The surface treatment of the adduct may be carried out by exposing the adduct to a gaseous acid or dispersing it in a dilute solution of the acidic substance, followed by drying.

The acidic substances used for the surface treatment are gaseous or liquid inorganic or organic acids. They include, for example, sulfur dioxide, hydrochloric acid, carbon dioxides, sulfuric acid, phosphoric acid, boric acid, formic acid, oxalic acid, acetic acid, propionic acid, lactic acid, caproic acid, salicylic acid, tartaric acid, succinic acid, adipic acid, sebacic acid, p-toluene sulfonic acid, phenol, phyrogallol, tannic acid, rosin, polyacrylic acid, polymethacrylic acid, alginic acid, phenol resin, resorcin resin, etc.

The acidic substances may be used in an amount enough to neutralize the amino groups exposed on the surface of the adduct powder. Too much a quantity may lower the hardening promoting effect of the resin. Therefore, it is preferable to decide the necessary quantity, for example, by a quantitative analysis of the amine.

The adduct compound accelerates the action of the latent hardener, and also acts singly as a hardener. The quantity of the adduct to be used is 0.1 to 40 parts by weight based on 100 parts by weight of the epoxy resin. With the increase of the quantity of the adduct, the ratio of the latent hardener may be lowered. A quantity less than 0.1 part by weight fails to harden the resin sufficiently. The quantity of the adduct may be increased to use no latent hardener. However, if the quantity exceeds 40 parts by weight, the hardened product is discolored and its characteristics are rather deteriorated.

The sum of the quantities of the hardening component comprising the epoxy resin, latent hardener and epoxy compound-dialkylamine adduct is 4 to 30% by weight of the total weight of the above mentioned (a), (b) and (c). The quantities of the hardening component and the electroconductive filler are complementary with each other. If the quantity of the hardening component is too large, the electroconductivity will be lost, whereas it is too small, the strength of the hardened product will be made insufficient.

The electroconductive paste of the present invention can be easily obtained by weighing out the above mentioned ingredients and kneading them with a three roll mill or the like.

Insufficiency in the degree of dispersion of the hardener will cause a fluctuation of the adhesive strength, etc. when the resulting paste is used with extremely small quantities of drop-feeds, so that it is more preferable that the epoxy resin, latent hardener and epoxy compound-dialkylamine adduct are sufficiently mixed to form the hardening component.

The electroconductive paste thus obtained has a long pot life, hardens rapidly when heated at a high temperature, releases a small quantity of gas upon hardening, and has excellent characteristics (especially heat resistance), and therefore it is particularly suitable for the bonding of electronic parts.

The electroconductive resin paste according to the present invention may contain another solvent, viscosity regulating agent, filler, coloring agent, etc. as far as no adverse effect is produced on the storage stability, hardening properties, etc.

The above explanation has referred to the case of chip bonding of semiconductor elements according to the drop-feed method, but the electroconductive resin paste of the present invention may be used for screen-printing, the formation of electroconductive circuits on a plastic plate, or the like.

The present invention is explained in more detail with reference to the following Examples.

EXAMPLES

Using as electroconductive filler mainly flaky silver powder, as the reactive solvent mainly phenylglycidyl ether (hereinafter abbreviated as PGE), and as the epoxy resin in all cases a bisphenol A-type epoxy resin (hereinafter abbreviated as BPA Epoxy), and in combination with various hardeners, electroconductive pastes were produced, and their characteristics were measured. The compositions of the pastes are shown in the Table, wherein BPA Epoxy is Sumiepoxy ELA-128 (the trade name of a bisphenol A-type epoxy resin produced by Sumitomo Chemical Company, Limited; its epoxy equivalent is 190 g/equiv.). As the solvent in Experiment No. 3 only, butylglycidyl ether (hereinafter abbreviated as BGE) was used. The hardener in Experiment No. 1 was Sumicure P-725 (the trade name of a polyamide resin produced by Sumitomo Chemical Company, Limited; its amine value is 300 mg KOH/g), and this product is widely used as a hardener for usual epoxy resins.

As the latent hardener, dicyandiamide (hereinafter abbreviated as DICY), 3-(4-chlorophenyl)-1,1-dimethylurea (hereinafter abbreviated as p-urea) and 3-(3,4-dichlorophenyl)-1,1-dimethylurea (hereinafter abbreviated as 3-urea) were used. As the epoxy compound-dialkylamine adduct, which is the hardening promoter, there was used the reaction product of Sumiepoxy ESCN-220 L (the trade name of a cresol-novolac-type epoxy resin produced by Sumitomo Chemical Company, Limited; softening point 70° C.; epoxy equivalent 215 g/equiv.) with dimethylamine, the reaction product being abbreviated as N-amine hereinafter. The "N-amine" in Experiment No. 3 is the reaction product of Sumiepoxy ESCN-220 HH (the trade name of a cresol-novolac-type epoxy resin produced by Sumitomo Chemical Company, Limited; epoxy equivalent 220 g/equiv.) with dimethylamine. The adduct in Experiment No. 5 is the reaction product of Sumiepoxy ESCN-220 L with dibutylamine, the reaction product being abbreviated as N'-amine, hereinafter. The adduct in Experiment No. 7 is the reaction product of an equal weight mixture of Sumiepoxy ESCN-220 L and Sumiepoxy ESA-011 (the trade name of a bisphenol A type epoxy resin produced by Sumitomo Chemical Company, Limited; softening point 69° C.; epoxy equivalent 490 g/equiv.) with dimethylamine, the reaction product being abbreviated as NA-amine, hereinafter. The adduct in Experiment No. 8 is produced by surface-neutralizing the said NA-amine with acetic acid, the adduct being abbreviated as neutralized NA-amine.

The electroconductive paste was produced by thoroughly mixing the epoxy resin and hardener, then adding the electroconductive filler and solvent, and sufficiently kneading the mixture of three roll mill.

The characteristics of the paste thus produced were measured as follows:

Usable duration (pot life)

The resin is drop-fed onto an alumina substrate, using a quantitative drop-feeding appliance (dispenser). On the drop-fed paste, Si-chips of a 1.5 mm square are placed one by one with the passage of time. The time (number of day) at which the chip does not adhere is determined as the pot life.

Quantity of released gas

As soon as the paste is drop-fed onto the alumina substrate a Si chip is adhered. By using a thermobalance, the quantity of released gas when the paste is hardened at 150° C. for 30 minutes, is determined as the quantity of weight reduction.

Adhesion strength and strength after heating

The adhesion strength between the resin and Si chip is measured for the sample hardened in the preceding paragraph. The adhesion strength after heating at 350° C. for 30 seconds is also measured. The adhesion strength and strength after heating are shown by the pushing pressure when the Si chip, pushed by a jig at its side, comes off.

Sheet resistance

The paste is printed on an alumina substrate to form a pattern 2.5 mm wide and 5.0 mm long, and the printed paste is hardened at 150° C. for 30 minutes. The resistance between the two ends in the lengthwise direction of the hardened film is measured, and it is expressed as the sheet resistance. (In this case, the sheet resistance is ½ of the total resistance.)

These characteristic values are shown in the succeeding Table.

The paste of Experiment No. 1 has too short a pot life and is unsuitable. The pastes of Experiment No. 2 and No. 6 have too low an adhesion strength. This is because with only the latent hardener the hardening temperature 150° C. is too low for sufficient hardening.

In Experiment Nos. 3, 4, 5, 7 and 8, hardening was accelerated by the presence of the epoxy compound-dialkylamine adduct, and the characteristic values were satisfactory enough. Especially, the result of Experiment No. 3 shows that, if the amine adduct is added in a sufficient quantity there is no problem, even without addition of any latent hardener.

Experiment No. 9 to No. 13 show the case where the ratios of the resin and hardener components in the paste were varied. In Experiment No. 9, the resin component was too little to give a sufficient adhesion strength, and on the contrary in Experiment No. 13, the resin component was too much for giving a good electroconductivity.

In Experiment No. 14 to No. 16, the electroconductive filler was gold, copper or aluminum powder. All of them gave satisfactory results.

TABLE

| Exp. No. | Filler (wt. %) | Solvent (wt. %) | Hardener (wt. parts per 100 wt. parts of resin) (wt. %) | Pot life (days) | Qty. of released gas (wt. %) | Adhesion strength (kg.) | Strength after heating (kg.) | Sheet resistance (mΩ/sq.) | Remarks |
|---|---|---|---|---|---|---|---|---|---|
| 1 | Silver 75% | PGE 10% | Polyamide resin 50 15% | 0.5 | 2.3 | 7.8 | 3.7 | 280 | For comparison |
| 2 | Silver 75% | PGE 10% | DICY 10, p-urea 5 15% | 5 | 2.7 | <1 | <1 | 570 | For comparison |
| 3 | Silver 68.4% | BGE 8.6% | N—amine 35 23% | 5 | 2.4 | 9.5 | 4.0 | 300 | The invention |
| 4 | Silver 75% | PGE 10% | DICY 10, 3-urea 5, N—amine 12 15% | 6 | 1.9 | 10.1 | 5.5 | 200 | The invention |
| 5 | Silver 75% | PGE 10% | DICY 10, 3-urea 5, N'—amine 5 15% | 6 | 2.0 | 10.2 | 6.0 | 220 | The invention |
| 6 | Silver 75% | PGE 10% | DICY 10, 3-urea 5 15% | 4 | 2.3 | 2.2 | <1 | 450 | For comparison |
| 7 | Silver | PGE | DICY 10, p-urea 5, | 6 | 2.9 | 9.8 | 6.5 | 270 | The in- |

TABLE-continued

| Exp. No. | Filler (wt. %) | Solvent (wt. %) | Hardener (wt. parts per 100 wt. parts of resin) (wt. %) | Pot life (days) | Qty. of released gas (wt. %) | Adhesion strength (kg.) | Strength after heating (kg.) | Sheet resistance (mΩ/sq.) | Remarks |
|---|---|---|---|---|---|---|---|---|---|
| | 75% | 10% | NA—amine 12 15% | | | | | | vention |
| 8 | Silver 75% | PGE 10% | DICY 10, p-urea 5, NA—amine neutralized 12 15% | 5 | 2.3 | 10.6 | 4.9 | 240 | The invention |
| 9 | Silver 97% | PGE 1% | DICY 10, p-urea 5, N—amine 12 2% | 1 | 0.2 | <1 | <1 | 100 | For comparison |
| 10 | Silver 90% | PGE 4% | DICY 10, p-urea 5, N—amine 12 6% | 3 | 0.7 | 5.2 | 3.7 | 130 | The invention |
| 11 | Silver 75% | PGE 10% | DICY 10, p-urea 5, N—amine 12 15% | 5 | 2.4 | 9.2 | 5.4 | 230 | The invention |
| 12 | Silver 60% | PGE 15% | DICY 10, p-urea 5, N—amine 12 25% | 6 | 6.4 | 9.6 | 4.8 | 1500 | The invention |
| 13 | Silver 45% | PGE 20% | DICY 10, p-urea 5, N—amine 12 35% | 7 | 11.3 | 9.5 | 4.5 | >100 MΩ/sq. | For comparison |
| 14 | Gold 75% | PGE 10% | DICY 10, p-urea 5, N—amine 12 15% | 5 | 2.5 | 10.7 | 6.3 | 410 | The invention |
| 15 | Copper 75% | PGE 10% | DICY 10, p-urea 5, N—amine 12 15% | 4 | 2.5 | 8.7 | 4.9 | 250 | The invention |
| 16 | Aluminum 75% | PGE 10% | DICY 10, p-urea 5, N—amine 12 15% | 5 | 2.3 | 8.9 | 5.4 | 470 | The invention |

What is claimed is:

1. An electroconductive paste comprising:
  (a) an electroconductive filler which is a powder of a member selected from the group consisting of noble metals, nickel, aluminum, copper and carbon;
  (b) an epoxy group-containing reactive solvent; and
  (c) a hardener comprising:
    (c-1) an epoxy resin,
    (c-2) a latent hardener selected from the group consisting of ureas, guanidines, hydrazines, hydrazides, amidines, triazines and azobenzenes, and
    (c-3) an epoxy compound-dialkylamine adduct, the alkyl group of said dialkylamine component having 1 to 4 carbon atoms and being unsubstituted or substituted with a hydroxyl, vinyl or phenyl group;

the percent by weight of (a), (b) and (c) being 95 to 50, 1 to 20 and 4 to 30, respectively, and the weight ratio of (c-1):(c-2):(c-3) being 100:0 to 30:0.1 to 40.

2. The paste according to claim 1, wherein the epoxy resin is at least one member selected from the group consisting of polyglycidyl ethers, polyglycidyl ether esters, polyglycidyl esters, glycidylamine compounds, epoxidized novolacs and epoxidized polyolefins.

3. The paste according to claim 1, wherein the latent hardener is at least one member selected from the group consisting of acetylmethyl urea, benzylurea, thiourea, 3-(substituted or unsubstituted)phenyl-1,1-di-$C_1$-$C_4$ alkylureas, acetylsemicarbazide, acetaldehyde semicarbazone, acetone semicarbazone, N,N'-diphenylguanidine, methylguanidine, biguanide, dicyandiamide, sebacic acid dihydrazide, succinic acid dihydrazide, adipic acid dihydrazide, tartaric acid dihydrazide, dicyandiamidine, hydrazobenzene, acetaldehyde phenylhydrazone, benzophenone phenylhydrazone, benzamidine, melamine, azobenzene and diaminoazobenzene.

4. The paste according to claim 1, wherein the dialkylamine component of the epoxy compound-dialkylamine adduct is a member selected from the group consisting of dimethylamine, dipropylamine, N-methylethylamine, N-ethylisobutylamine, diallylamine, dibenzylamine, N-ethylethanolamine and diethanolamine.

5. An electronic part produced by bonding a chip to a metal lead frame and/or substrate with the electroconductive paste of claim 1.

6. The paste according to claim 1, wherein the epoxy group-containing reactive solvent is a member selected from the group consisting of phenylglycidyl ether, butylglycidyl ether and neopentylglycol glycidyl ether.

* * * * *